United States Patent
Wilson et al.

(10) Patent No.: US 10,433,089 B2
(45) Date of Patent: Oct. 1, 2019

(54) DIGITAL AUDIO SUPPLEMENTATION

(71) Applicant: Fideliquest LLC, Minnetonka, MN (US)

(72) Inventors: Jeff Wilson, Plymouth, MN (US); Jayson Tomlin, Minnetonka, MN (US)

(73) Assignee: Fideliquest LLC, Minnetonka, MN (US)

( * ) Notice: Subject to any disclaimer, the term of this patent is extended or adjusted under 35 U.S.C. 154(b) by 0 days.

(21) Appl. No.: 15/042,926

(22) Filed: Feb. 12, 2016

(65) Prior Publication Data

US 2016/0240212 A1    Aug. 18, 2016

Related U.S. Application Data

(60) Provisional application No. 62/115,732, filed on Feb. 13, 2015, provisional application No. 62/280,582, filed on Jan. 19, 2016.

(51) Int. Cl.

| | | |
|---|---|---|
| *H04S 3/00* | (2006.01) | |
| *H03G 3/32* | (2006.01) | |
| *G10L 21/0364* | (2013.01) | |
| *G10L 19/012* | (2013.01) | |
| *G10L 21/003* | (2013.01) | |

(52) U.S. Cl.
CPC .......... *H04S 3/008* (2013.01); *G10L 21/0364* (2013.01); *H03G 3/32* (2013.01); *G10L 19/012* (2013.01); *G10L 21/003* (2013.01); *H04R 2420/01* (2013.01); *H04S 2400/15* (2013.01)

(58) Field of Classification Search
CPC . G10L 21/0234; G10L 21/003; G10L 19/012; G10L 21/0364; H03G 3/32; H04S 3/008; H04S 2400/15; H04R 2420/01

USPC .......................... 381/77, 119, 61, 1; 700/94
See application file for complete search history.

(56) References Cited

U.S. PATENT DOCUMENTS

| | | | | |
|---|---|---|---|---|
| 3,784,750 A | * | 1/1974 | Stearns | H03G 9/02 381/106 |
| 5,487,113 A | * | 1/1996 | Mark | H04S 1/002 381/1 |
| 5,847,113 A | * | 12/1998 | Bermes | C09B 47/24 540/131 |

(Continued)

FOREIGN PATENT DOCUMENTS

| | | |
|---|---|---|
| EP | 1630790 | 4/1996 |
| EP | 0706299 | 5/2006 |
| EP | 1653627 | 5/2006 |

OTHER PUBLICATIONS

International Search Report and Written Opinion for PCT/US2016/017811, dated May 11, 2016, 11 pages.

(Continued)

*Primary Examiner* — Disler Paul
(74) *Attorney, Agent, or Firm* — Fish & Richardson P.C.

(57) ABSTRACT

A computer-implemented method is disclosed that includes identifying a digital sound file that contains data for producing audible sound content; identifying and selecting a digital source of supplemental sound content; and adding the supplemental sound content to the audible sound content to produce supplemented sound content, wherein the supplemental sound content is added at a sub-audible intensity level so as to cause unique brain activations in users who listen to the supplemented sound content.

25 Claims, 10 Drawing Sheets

(56) References Cited

U.S. PATENT DOCUMENTS

| | | | | |
|---|---|---|---|---|
| 6,311,155 B1* | 10/2001 | Vaudrey | ........... | G11B 20/00992 |
| | | | | 381/10 |
| 6,770,042 B2* | 8/2004 | Lee | ................... | A61H 23/0236 |
| | | | | 601/47 |
| 7,725,203 B2* | 5/2010 | Richards | .................. | H04R 3/04 |
| | | | | 700/94 |
| 8,184,834 B2* | 5/2012 | Oh | ........................ | G10L 19/008 |
| | | | | 348/738 |
| 8,913,753 B2* | 12/2014 | Cohen | ....................... | H04S 1/00 |
| | | | | 381/56 |
| 9,818,415 B2* | 11/2017 | Nurmukhanov | ...... | G10L 19/018 |
| 2004/0196988 A1* | 10/2004 | Moulios | ............... | G10H 1/0091 |
| | | | | 381/119 |
| 2006/0281403 A1* | 12/2006 | Richards | .................. | H04R 3/04 |
| | | | | 455/3.06 |
| 2011/0172793 A1 | 7/2011 | Richards | | |
| 2012/0057715 A1* | 3/2012 | Johnston | ............... | G10L 19/008 |
| | | | | 381/63 |
| 2014/0334634 A1* | 11/2014 | Lewis | .................. | G10K 11/175 |
| | | | | 381/73.1 |
| 2015/0181332 A1 | 6/2015 | Benway et al. | | |
| 2016/0125867 A1 | 5/2016 | Jarvinen et al. | | |

OTHER PUBLICATIONS

Extended European Search Report in International Application No. 16749988.8, dated Feb. 13, 2018, 7 pages.
International Preliminary Report on Patentability for PCT/US2016/017811, dated Aug. 15, 2017, 6 pages.

\* cited by examiner

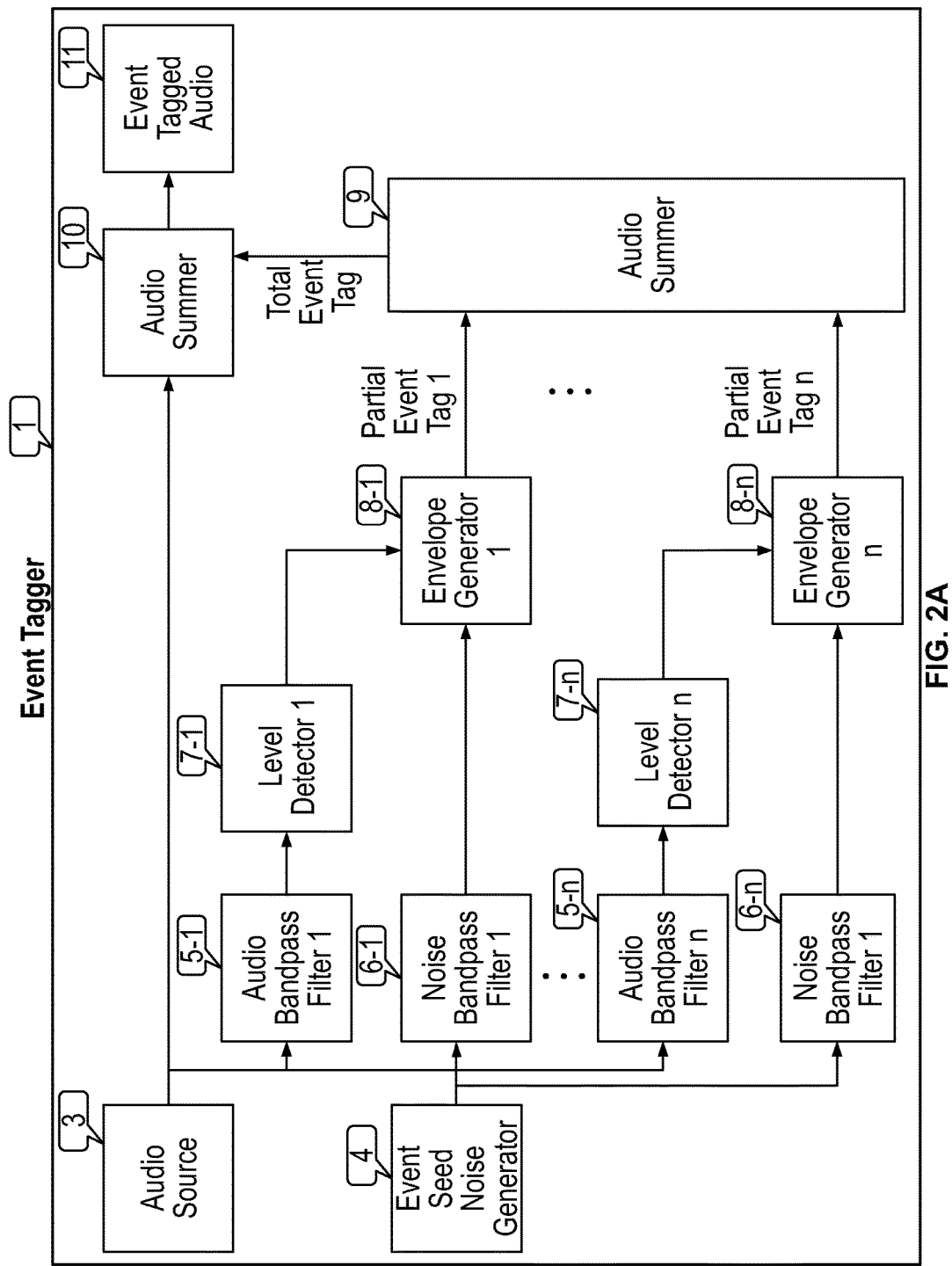

DIGITAL AUDIO SUPPLEMENTATION

CLAIM OF PRIORITY

This application claims the benefit of priority to U.S. Provisional Application Ser. No. 62/115,732 filed on Feb. 13, 2015, and U.S. Provisional Application Ser. No. 62/280,582 filed on Jan. 19, 2016, the entire contents of which are hereby incorporated by reference.

TECHNICAL FIELD

This document generally describes technology related to processing digital audio files (whether fixed files or streams), including in the improvement of computer operation for enhancing the perceived sound of music and other sound from such files.

BACKGROUND

Audiophiles and ordinary listeners of music, movies, and other media forever seek that perfect recorded sound—one that fully and authentically recreates a live performance. Digitally-recorded sound is often considered superior to analog sound because of its precision and lack of distracting noise (e.g., pops, tape hiss, etc.). At the same time, many people dislike digital sound because it lacks warmth and other hard-to-quantify qualities that occur in the live, original source, or even in analog recordings.

There is thus a disconnect between digital sound recording and cognitive perception of sound. Recorded and reproduced sounds, especially digitally-recorded sound, fail to cause a listener's brain to have the same neural activity that the listener would experience while listening in-person to an original live performance for the same sounds. A general opinion among audio engineers is that sounds recorded and reproduced with analog techniques give a more lifelike reproduction than do sounds that are recorded and reproduced with digital techniques. To fix such problems, especially with digital recordings, some engineers digitally simulate the distortions of analog recording gear in their recording, such as recording tape saturation and vacuum tube non-linearities. Engineers may also add such distortions to an otherwise digital recording by inserting analog gear (e.g., analog summing busses) into the digital recording chain. In addition, recording engineers may simply increase bit-depth and sample rate in an effort to fix the problem by increasing the data content of the recording.

SUMMARY

This document generally describes computer-based technology for supplementing, or tagging, original digital audio content (e.g., music or sound from a movie) with additional digital audio content that improves a listener's cognitive perception of the audio when it is played to the listener. The supplementing material is inserted into the recording at a sub-audible level, and may take a variety of forms, including various forms of non-harmonic sound, tailored random noise, and other types of content that have been determined to have a particular cognitive effect on a listener. Such cognitive effects may include causing a certain part of an audio signal to stand out to a listener relative to other sounds, to create a warmer feel for the particular sound, to provide greater resolution of a particular sound by a listener relative to other sounds in a recording, to reproduce other effects similar to those achieved in the mind of a listener of live music, and other similar positive effects.

The techniques trigger brain activity necessary for the human brain to respond to the recorded sound in a manner like the brain would respond to a live performance. This is provided, in certain embodiments, by introducing additional sounds in a recording at such a low volume that the additional sounds cannot be heard in the recording ("sub-audible") by a human, but at a high enough level that can trigger specific brain activity in the listener. The supplementing content may be sub-audible because it is essentially below the level of being heard when a piece of audio is played at a normal volume level, or it is drowned out by the main content when the recording is played at an elevated volume level. In certain circumstances, the supplementing content may vary in volume proportionately with variations in the volume of the content that is being supplemented.

The supplementing content may be various forms of non-harmonic sound. As just one example, tailored white noise or other forms of tailored random noise may be added to a music or other audio signal at a sub-audible level, to provide a more pleasing auditory experience for a listener. The sub-audible content may vary across a signal at a particular time, such as by being applied at a particular frequency level (e.g., spoken dialogue) or to a particular channel of a multi-channel signal (e.g., to the center channel of a surround-sound signal so as to affect listener perception of spoken dialogue more than other content in an audio signal), so that such portion of the signal "pops" relative to less important parts of the signal. The sub-audible content that is provided as signal supplementation may also vary over time, such as by applying sub-audible content to dialogue portions of a movie when there are such portions, and to other portions when there are not, and/or by changing the type of sub-audible content at different times (e.g., applying tailored white noise at certain points, or to certain types of dominant main content, and tailored pink noise to other types of main content, where tailoring of the noise may include, among other things, adjusting the volume level of the noise in proportion with changes in volume of the main content signal). The volume level of the supplemental sub-audible content may also change in direct (whether linear or non-linear) proportion to the volume level of the audible main content of the signal—e.g., so that the sub-audible content is louder when the music or other content is louder (which may be applied channel-by-channel).

The added sub-audible content is referenced in certain locations in this document as audio "event tags" and audio "channel tags," and it is included so as to cause the brain to be more sensitive to the details in the sound, to assist the brain in keeping track of separate sounds and not confusing them, and to cause the brain to be more sensitive to the soundstage spread. Audio event tags, as discussed here, are applied to particular, generally short-term, components within an audio signal (e.g., a particular instance of dialogue, or a particular striking of a cymbal, as isolated from other components occurring at about the same time such as a vocal occurring when the cymbal is hit), whereas audio channel tags are more general and typically persist longer (e.g., through the entire recording, such as from the beginning to end of a song or the beginning to end of a scene in a movie or television show). As examples, audio event tags may be five seconds long or shorter on average for a particular recording, whereas audio channel tags can be more than ten seconds long, more than 30 seconds long, or more than one minute long on average for the same recording. The two tags together result in audio recording/playback that can closely replicate a live in-person listening experience, and can better make important sounds "pop" to a user.

In one implementation, a computer-implemented method for enhancing digital sound is disclosed. The method comprises identifying a digital sound file that contains data for producing audible sound content; identifying and selecting a digital source of supplemental sound content; and adding the supplemental sound content to the audible sound content to produce supplemented sound content, wherein the supplemental sound content is added at a sub-audible intensity level so as to cause unique brain activations in users who listen to the supplemented sound content. The digital sound file can include both visual and audible components. The supplemental sound content, in some aspects, can comprise random noise, including tailored white noise or pink noise.

In certain aspects, the method also comprises identifying one or more channels of a multi-channel sound signal to which supplementation is to be applied; and adding the supplemental sound content to only the identified one or more channels. The process can also include identifying a particular sound item in the audible sound content; and adding supplemental content within a selected frequency range that corresponds to a frequency range of the identified particular sound item. Moreover, the method can additionally include transmitting the supplemented sound content to a plurality of different client audio players for playing of the audio to users so that the users consciously hear the audible sound content, but do not consciously hear the supplemental audio content.

In certain aspects, the supplemented sound content is arranged to produce cognitive effects in a listener that are not achieved when the listener is presented with the audible sound content only. The supplemental sound content can, for example, comprise a first source of sound content whose amplitude in the supplemented sound content is made to vary over time in correlation with changes in amplitude of the audible content; and a second source of sound content that is selected and added to the original content that is separate from the first source of sound content.

In another implementation, a sound file is disclosed that is made by a process of steps that comprise identifying a digital sound file that contains data for producing audible sound content; identifying and selecting a digital source of supplemental sound content; and adding the supplemental sound content to the audible sound content to produce supplemented sound content, wherein the supplemental sound content is added at a sub-audible intensity level so as to cause unique brain activations in users who listen to the supplemented sound content.

In yet another implementation, there is disclosed a device containing one or more tangible, non-transitory machine-readable storage media that store instructions that, when executed by one or more computer processors, perform certain operations. Those operations comprise identifying a digital sound file that contains data for producing audible sound content; identifying and selecting a digital source of supplemental sound content; and adding the supplemental sound content to the audible sound content to produce supplemented sound content, wherein the supplemental sound content is added at a sub-audible intensity level so as to cause unique brain activations in users who listen to the supplemented sound content.

In certain implementations, the systems and techniques discussed here may provide one or more advantages. For example, improved sound may be provided to listeners of music, television, or movies, which will improve their enjoyment of digital content they have acquired. Such improvement may lead to the ability of a provider of digital content to increase its sales volume and/or prices, to position itself as a provider of premium content, and to otherwise separate itself from its competitors. The supplementation that provides such an improvement may also, in particular implementations, be inserted seamlessly into existing distribution networks, such as by modifying the content of sound files (whether transmitted as a complete file or streamed) without changing the format of the files, and thus making it possible to listen to the files using media players that could play the original file.

The details of one or more embodiments are set forth in the accompanying drawings and the description below. Other features and advantages will be apparent from the description and drawings, and from the claims.

DESCRIPTION OF DRAWINGS

FIG. 2A is a diagram of an event tagger according to certain example embodiments.

Like reference symbols in the various drawings indicate like elements.

DETAILED DESCRIPTION

Figure 1A:
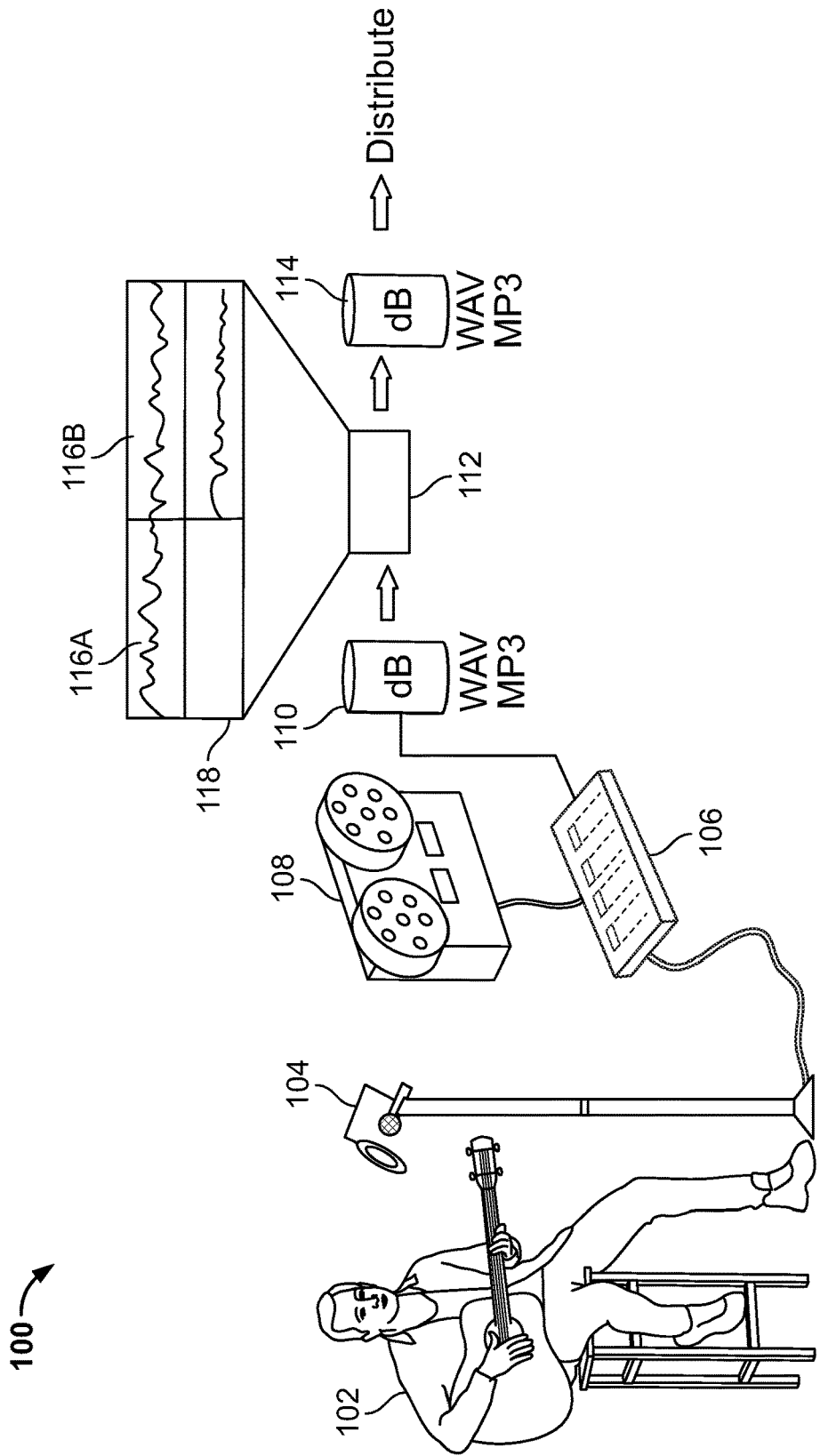
FIGS. 1A and 1B are conceptual diagrams of systems for supplementing audio signals for improved performance.

This document generally describes computer-based systems and techniques for processing digital sound files to improve the sound that is perceived by a typical listener when the sound files are played. In general, the improvement that is made includes purposefully inserting digital content at a sub-audible level as compared to the audible sound (e.g., dialogue, vocals, sound effects, and/or instrumentals) that is already part of the original recording. The inserted sub-audible content may be in the form, for example, of typical tailored noise formats, including tailored white noise (an essentially random signal with a constant power spectral density, and including Gaussian white noise), pink noise (a signal whose power spectral density is inversely proportional to signal frequency), red noise, brown noise, or blue noise. The inserted content may also be other forms of non-harmonic sound whose content is independent of the original content (e.g., it is not an artifact created by converting the original content from one resolution to another). Such additional content is believed to trigger a listener's brain so that it more readily accepts and differentiates the main audible content in a signal, and thus makes such audible content sound more pleasing and realistic to a listener of recorded sound.

The inserted sub-audible content—referred to frequently below as a "tag" that is added to a sound file—may be applied equally through time for the signal that represents the sound and to the entire sound, or can be varied over time and varied over different parts of the total sound signal at a particular point in time. Variability over time may be achieved by switching a source of sub-audible sound, whether by changing the format of the sound that is supplemented into a signal of main content (e.g., switching from white to pink noise) or by changing the way that a particular format of sound is tailored (e.g., changing its frequency or amplitude level). Also, the amplitude of the added sub-audible content may be directly related to the amplitude of the main content of the signal at the time the sub-audible content is added (what is referenced as a "sweetening" or an "event tag" below). For example, when a piano key is struck in the main content, the amplitude of the sub-audible supplemental content may spike and recede along with the amplitude of the audible original content. In certain instances, the rise and fall in amplitude of the sub-audible content may be in phase with that of the main content, and in other instances, the raise and/or fall may be slightly advanced or slightly retarded relative to that of the main content (where both the rise and fall may be advanced or retarded, or one may be advanced and the other retarded such as advancing the rise and retarding the fall, so that the sub-audible part of the signal is "wider" timewise than the audible part of the signal).

Both sub-audible content that changes over time (e.g., in amplitude) and sub-audible content that does not change, or that changes less frequently or less severely over time, may also be employed. Such second form of sub-audible content may be referred to below as a "channel tag." This multi-layered supplementation (with event tags at one level, tied to specific events in the original content, and channel tags at another, applied to the recording more generally) may provide multiple forms of cognitive effect of a person who listens to the supplemented content when it is played by a media player (e.g., iPod, DVD player, CD Player, media streaming app, etc.).

Variability across a signal at a particular time may be achieved by using supplementation applied at only particular frequency ranges or only particular channels of a multi-channel signal. For example, an analysis may be made of the signal for the original content, and supplementation may be provided using content at frequencies that correspond to the frequency of the current original content. As one example, during a period of time when the original content is in the frequency range of 500 Hz to 1 KHz, the supplementing content may be selected so that it too is in the same range, in a slightly wider range centered on the same range, or another range that is based on the detected 0.5-1 KHz range.

Notably, such changes may be made without making changes to the original content itself. Rather, such original content (the song being improved or the movie soundtrack being improved) may be analyzed, and then simply supplemented and placed back into a file of the original format (or a different format, e.g., where an original (unprocessed) WAV file is accessed for analysis and then used to produce a supplemented WAV file, a supplemented MP3 file, a supplemented FLAC and/or ELAC file, and so on). In certain instances, changes may be made to the original content that are separate and independent of the supplementation process, such as by applying traditional audio processing techniques to the original content, including by compressing or expanding the soundstage of the original content, equalizing the original content, or other such traditional sound engineering processes. But such additional processing is generally independent of the supplementation discussed here, and used for different effect. In some implementations, the supplementation process may have minor incidental effects on the original content, and the processing discussed here may act to zero out those effects as part of the processing, so that the end supplemented file is, in effect and as perceived by a listener, the original sound file without changes other than the added sub-audible content.

Also, the addition of selected digital content for sub-audible introduction described here is to be distinguished from intentional or unintentional addition of analog noise to sounds recordings, or the addition of artifacts that arise from some other transformation being performed on a recording, whether digital or analog. The content of such added noise is not selected, controlled, or known, but is instead generally a by-product of operations such as added tape hiss from producing an analog tape copy of a recording. For example, the sub-audible supplementation discussed here is not an artifact that enters a recording as a result of merely attempting to convert the recording, such as by aliasing artifacts that may result from digital recording and sample rate conversion, or from dithering that results from digital sampling rate conversion (which is an attempt to get a cleaner signal, not to create a cognitive effect of adding to soundstage and distinctions between components in the recording). The techniques discussed here are also not the noise that may be generated as part of producing the final sound on a music player, such as tape modulation noise, hisses and pops from records, noise from magnetization of a tape head, turntable rumble, or noise generated by the circuitry of the electronic playback device.

Figure 1B:
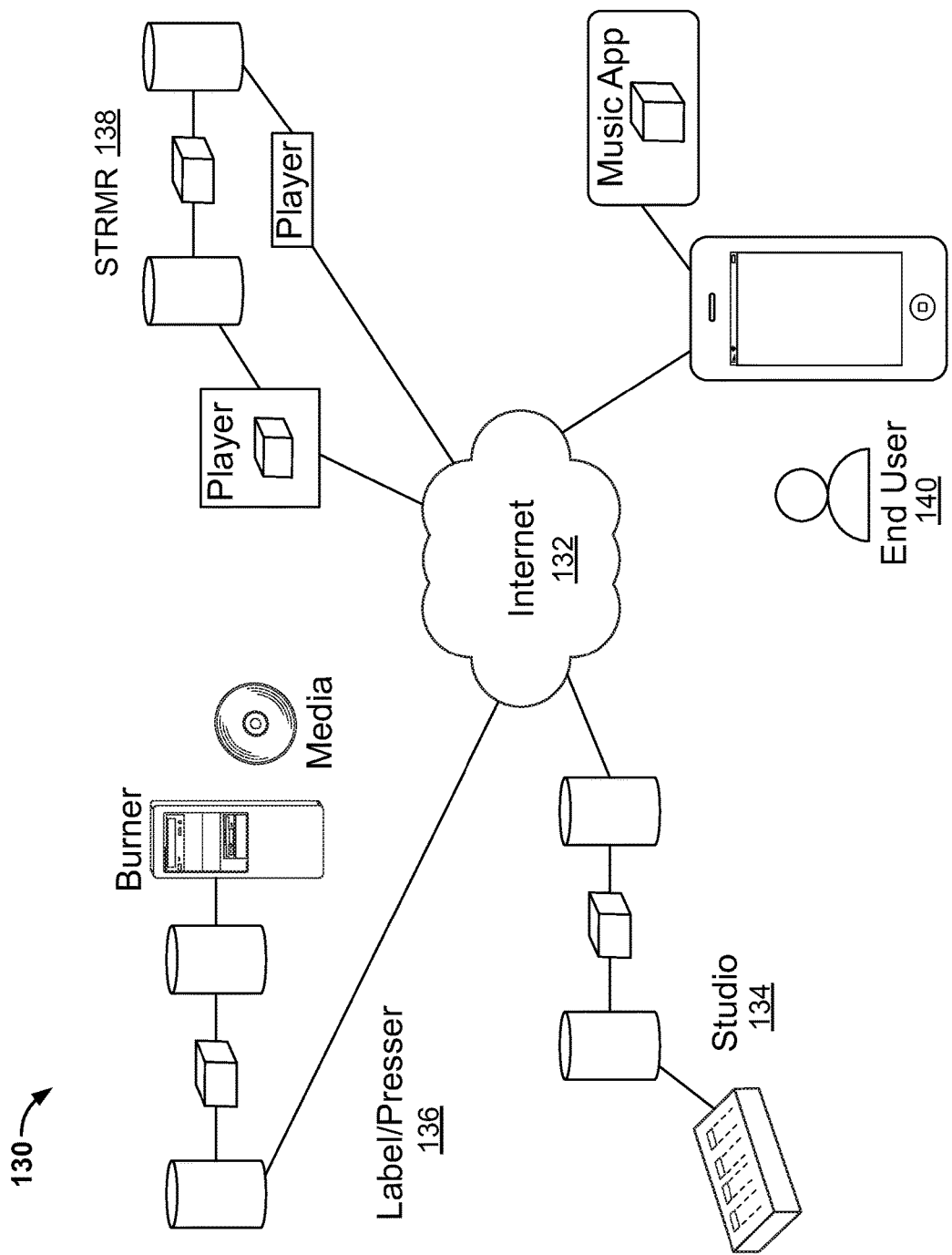

FIGS. 1A and 1B are conceptual diagrams of systems for supplementing audio signals for improved performance. FIG. 1A in particular shows a system 100 and process of capturing a sound file and then supplementing the captured audible content in the sound file with additional stored digital content at a sub-audible level.

As shown in the figure, the sound in system 100 is created by a musician 102 who sings and plays a guitar into a microphone 104 in a music recording studio. A technician may take that sound, and sound from other sources such as other musicians—whether that sound is captured previously or simultaneously as the sound from musician 102—and may mix it through mixing board 106 for storage with tape machine 108. Such capture and storage may occur through various known manners as appropriate for a particular recording session. In other embodiments, the audio may be captured with, or added to, a video file, such as when a sound movie is being mixed and edited, and where the sound may have been captured with the video or may be added later, such as with voice-overs or narration applied over a video. In either instance, the mention of sound files or sound signals is intended here to refer to sound stored and provided in various forms, and as sound alone or sound along with video or other content (e.g., moving or fixed graphics for narration). The supplementation discussed here may be performed as part of the initial sound engineering process (e.g., before or after tracks are combined) or may be performed after all sound engineering has occurred (e.g., to improve the sound of a recording that may have been produced and released years earlier).

The ultimate sound file may take a variety of forms and formats. For example, the sound may have a single channel (monophonic), a pair of channels (stereophonic), or more channels such as 5.1, 7.1, 9.1, or Atmos surround sound. The sound file may also be formed by combining sound captured from microphones, sound previously captured and saved, digitally-generated or synthesized sound, and other sound sources. The sound file may be a single file, such as an MP3, MP4, WMA, or WAV file, or a collection of files that are accessed together to produce human-discernable sound when played together. The delivery of the file may occur by the entire file being delivered and then played, or as a real-time streaming of the file over a network such as the Internet (though with the possibility of buffering and other storage). The supplementation of the file may occur before it is played or as it is played, in near real-time.

A database 110 shows the storage of one or more sound files like those just discussed. For example, a technician may have mixed the various tracks for various songs for a record album, and digital files for each song may be saved on tangible storage (e.g., a hard drive, optical drive, or flash drive) for each such song, or a single file may represent all of the songs on the album strung together. Various different file formats may be used, and the particular mechanisms for storing the files will naturally differ for different implementations.

An audio supplementing device 112 is provided, such as in the recording studio or elsewhere, for processing the audio files stored in database 110 to improve the way they are perceived by a listener when they are played. Details of examples for such a device 112 are shown in FIGS. 2A-2G and the corresponding description below. In general, the device 112 accesses digital representations of sound content that are separate from the source files just discussed in database 110, and adds such content to those other files at a sub-audible level—a level that is too quiet for a listener to consciously hear when played at normal volume and so low that it is at least drowned out by the main content if played at an extremely elevated volume. Such supplemental content may come from a variety of sources, including sound files store in database 110 or from real-time sound generators, such as white noise or pink noise generators that can be accessed by the system 100 and added digitally to the original content, though at a sub-audible volume level.

The supplementation of the original content with sub-audible content is shown schematically by the two-part graph having portions 116A, 116B. The graph shows a signal graphed against time, where the signal is shown as having a varying value such as amplitude for purposes of illustration though the signal may take variety of forms. An audible line 118 schematically represents a gain level determined to be perceptible to a typical listener of the sound when the sound file is played in standard manners. Though the line is shown here as being flat, it may in certain implementations vary with the volume of the original content, as louder original content will make it harder for a listener to hear supplemental content, so that such supplemental content may be made relatively louder and it can still be sub-audible. The left portion 116A shows the original musical or other audible content above the audible line 118, while the right portion 116B shows the added sub-audible content. Although the representation shows two separate signals for illustration, the combined signal in practice may be a single signal (or a single signal for each channel of a multi-channel overall signal).

The supplemented signal is then shown stored as a file in database 114. The format of the supplemented file may be the same as the format of the original file, so that any digital music player to which the original file was intended would also be appropriate for playing the supplemented file. The file may also take other formats, and a single input file of format A may be supplemented and then output as different files of format A, format B, etc. Database 114 may be the same as database 110, or may be a separate database to better keep the various supplemented files away from the original files, so as to avoid accidental mixing or misapplication of the different file types. The names of the supplemented files may be the same as those of the original files, or may be the same except with a prefix or suffix added so as to indicate to a person or device reviewing the names that the files have been processed by such supplementation.

The system 100 may then make the supplemented file accessible for distribution in various manners, as indicated schematically by the arrow emanating from database 114. Various different example situations by which the supplementation of a file may occur, and manners in which the content can be distributed, are shown next in FIG. 1B.

FIG. 1B shows schematically a variety of systems for supplementing digital audio content to improve user-perceived sound of the digital audio content. An overall system 130 centers around the Internet 132 and other networks that can connect various nodes in a broader network, including clients and servers.

In a first example, a studio 134 is shown similar to the studio just discussed for FIG. 1A. The studio includes various mechanisms for capturing, combining, storing, editing, and otherwise manipulating digital and analog sound representations. The studio 134 also includes an audio supplementing device like those described above and below, for adding sub-audible or other non-audible content to a signal to improve the perceived sound of the signal when it is played. Appropriate databases and other components may also be provided for such creator-side audio supplementation. Thus, in this example, the processing of sound through sub-audible supplementation may be performed near the source of the recording, such as by a traditional sound engineer in a recording studio 134.

Sound files may be transferred, either before or after supplementation, to a record label and/or presser plant 136. The presser plant 136 may turn the sound file into physical music media like audio CDs, DVDs, and vinyl albums. The presser 136, before recording on such physical media, may also or alternatively have an audio supplementing device and related components to add sub-audible content, such as tailored random noise or other non-harmonic content, to the signal and to create a supplemented digital file that can then be pressed. Thus, a record label may process sound in the manners discussed above and below, even where a particular track was not processed when it was recorded. For example, a particular label may want all of the music it distributes via CD to have this particular process, and may advertise its CDs as having such processing applied.

In another example, a streamer (called STRME) 138 may receive a file from the studio 134, the label, or another source in an un-supplemented form. The streamer 138 may wish to advertise that the songs it streams, or the movies it streams, are higher quality than those streamed by its competitors. As a result, streamer 138 may employ one or more audio supplementation devices to add sub-audible audio, either before files are streamed (e.g., by marching through each file in a library, processing it, and saving it with supplemented audio content in it) or as they are streamed. Such processing may also be performed for the streamer 138, such as by a third-party company that may be given access to the digital files of the streamer's music or movie catalogue, and may output improved, supplemented versions of each of the files it encounters. Such third-party processing may allow the third party to add its processing expertise to the process and also to maintain a level of secrecy over particular settings that may be advantageous for certain special types of processing. The streamer 138 may also have one or more media playing servers connected to the Internet 132 to respond to requests from appropriate client devices to receive streams of particular songs, movies, or television programs.

As another location at which sound file supplementation may occur, a music player 140 operated by an end user, and executing a media player application, is shown. The music player 140 may be generic or may be directly associated with a particular streaming or other similar service, and may play MP3, WAV, and other file formats that encode sounds. The application may include, directly or as a plug in, a sub-application that performs processing that inserts sub-audible sound content into a signal before the signal is played to a user of the music player 140. Again, the processing may occur before a user requests to listen to a particular media file (e.g., by processing a file as soon as it is downloaded onto the user's device or by processing multiple already-downloaded files en bulk), or may occur as a particular file is played to the user.

FIGS. 2A-2F show various arrangements of structures for mechanisms that supplement audible sound content with sub-audible sound content. The systems shown here may variously tag a sound file with two types of sub-audible tags: (1) audio event tags, and (2) audio channel tags. As noted above, audio event tags are associated with particular components within an audio signal, such as a particular note or chord played by an instrument in a recording. Audio event tags cause the brain to be more sensitive to the details in the sound. They also assist the brain in keeping track of separate sounds and not confusing them. Audio channel tags are more generally associated with the signal than are audio event tags, and thus persist longer (often through the entire signal). Audio channel tags cause the brain to be more sensitive to the soundstage spread put into the recording by the recording engineer. The two tags together result in audio recording/ playback that can closely replicate a live in-person listening experience.

Audio Event Tags—For each audio event (that is, for each sound, such as each note that an instrument plays) a sub-audible sound is generated and attached to the recording. Thus, the sub-audible sound "tags" the sound event in the recording to trigger an accompanying brain activity. The events may be identified by analyzing an existing stored signal for changes in amplitude in particular channels of the signal and at particular frequency ranges. Particular amplitude threshholds may be established in advance, and an event may be identified as occurring between a start and end time when a particular threshold is exceeded. The process may then add supplemental content of a selected type during that time window, and to the track where the event was identified as having occurred.

Audio Channel Tags—In addition to audio event tags, a sub-audible sound is generated and added to each channel. The audio channel tag usually persists through most or all of the recording. The particular selected channel tag may be dependent on the original content for the recording or independent of it. For example, tailored white noise may always be used by a particular operator to supplement musical content or musical content of a particular type (e.g., for rock as opposed to classical). Alternatively, some or all of a recording may be initially analyzed, and the format of content to be added as the audio channel tag may be selected as a result of such analysis. For example, where the volume level of the recording varies greatly, one type of audio channel tag may be used, whereas a different type may be selected when the volume of the original content does not change much or does not change with great speed (e.g., where the sound is more melodic and less percussive).

The audio event tag is crafted such that the human brain connects the tag with the audio event, and thereby, the brain is stimulated to increase its sensitivity to all frequency components of the particular audio event.

To craft the audio event tag, the audio event is analyzed to determine all of the frequency components present in the event, and their respective amplitudes—e.g., by deconstructing the signal by frequency and analyzing the deconstructed components. Each detected component of the audio event contributes to the creation of part of the audio event tag, so that the audio event tag is a function of multiple different parts of the signal that are separated from each other for analysis and that all occur at the same time in the signal.

The creation of the tag starts with a tailored random noise source or other non-harmonic noise source (the "seed noise"). The seed noise can include an amplitude that rises slightly with frequency (e.g., between pink noise, which has flat amplitude across all audio frequencies, and white noise, which rises 3 dB per octave). For each frequency component found in the audio event, a band-limited section of the seed noise is added to the tag at an amplitude relative to the amplitude of the component found in the audio event—but at a sub-audible amplitude.

Filters can be used to limit the seed noise to approximately one-half octave below the component to two-and-one-half octaves above the component (the bands in the bass region are from one-half octave below to one-and-one-half octave above, because of the steep frequency response slope of the human ear and the mild filter curves). The total amplitude of the tag is thus generally in the range of −45 dB to −50 dB relative to the audio event. The audio event tag according to certain embodiments can be about 10 milliseconds wider than the audio event at high frequencies, and about 150 milliseconds wider at the bass frequencies, and can be on a sliding scale between high and low frequencies. The tag can be centered in time with the audio event. In other instances, the tag may be slightly advanced or slightly retarded in time with respect to the audio event. In yet other embodiments, the tag can be wider or narrower than the event, and shifted in time (advanced or retarded) so as to not be centered exactly on the event. In recordings with more than one channel, the tags are most effective when each channel has its own seed noise that is different than and selected independently of the seed noises for other channels, where different seeds do not correlate with each other (e.g., one channel is seeded with white noise from a first source, and another is seeded with what noise that is from a separate source or sufficiently out of phase with the first source (e.g., if a single looping sound file is used)). In other instances, the selection of seed noise for each channel may differ from that for one or more other channels, but may be interdependent with (though still different from) the seed noise selected for those other different channels.

For the audio channel tag, the seed noise can be roughly the inverse of the Fletcher-Munson curves for the amplitude at which each particular audio channel tag will be used. That is, its frequency spectrum is adjusted for equal hearing sensitivity at all frequencies. The audio channel tag is a constant application of the seed noise throughout the recording, except where the recorded sound becomes very quiet. Then the seed noise may be dropped in amplitude so that it does not become audible. The seed noise for the audio channel tags is different for each channel (i.e., the seed noise for one channel does not correlate to the seed noise for the other channels) for maximum effectiveness. They also do not correlate with the seed noise for any of audio event tags, again for maximum effectiveness.

Where the digital sound file is still in the form of a multi-track recording, the processing of the signal may be performed on such multiple tracks. In such a situation, the tags can be applied in a different way in the early stages of the recording than in later stage. When a multitrack recording is being created by a recording engineer, each instrument generally starts out as a separate recording. The recording engineer makes the final stereo or surround sound recording by mixing different amounts of each instrument into different channels, to adjust both their respective loudness in the final recording, as well as to place the perceived sounds in different locations. In the case of multitrack recordings, the audio event tags can be applied to the individual tracks before mixing, and the audio channel tags can be applied to each channel of the final mixed recording.

The seeds for the audio event tags or the seeds for the audio channel tags can come from a single looped sound file of noise. The seeds can be de-correlated from each other by simply starting at different locations in the sound file. Current testing suggests that a minimum spread of 500 milliseconds appears to the brain to be completely de-correlated. The seeds may also be produced in real-time by digital or analogue techniques, rather than being accessed from a previously-stored file.

Referring specifically to FIG. 2A, an event tagger adds event tags to one channel or one track of audio. The incoming audio is analyzed by being fed into a bank of a plurality of filters (5-1 thru 5-N), where each filter defines a frequency range that is different than the other ranges (though there may be some overlap), each followed by a respective plurality of level detectors (7-1 thru 7-N). The result is a frequency vs. time vs. level map of the incoming audio—a correlation of amplitude level at particular times in a recording and at multiple different discrete frequency ranges.

For each frequency band of incoming audio, there is a tailor-made partial tag that is optimized for that frequency band. So, for each frequency band of incoming audio, the noise from the event seed noise generator is passed thru a respective filter (6-1 thru 6-N) to optimize the frequency spread of the noise for maximum effectiveness of the partial event tag for the associated audio band.

The respective plurality of envelope generators (8-1 thru 8-N) take the information from the level detectors and craft a volume envelope to turn the noise into a partial event tag. The partial event tag is adjustable in time, duration, and level relative to the associated audio frequency band.

All partial event tags are added together in the first audio summer (9) to create the total event tag. The second summer (10) adds the total event tag to the incoming audio to create the event tagged audio (11) output.

Figure 2B:
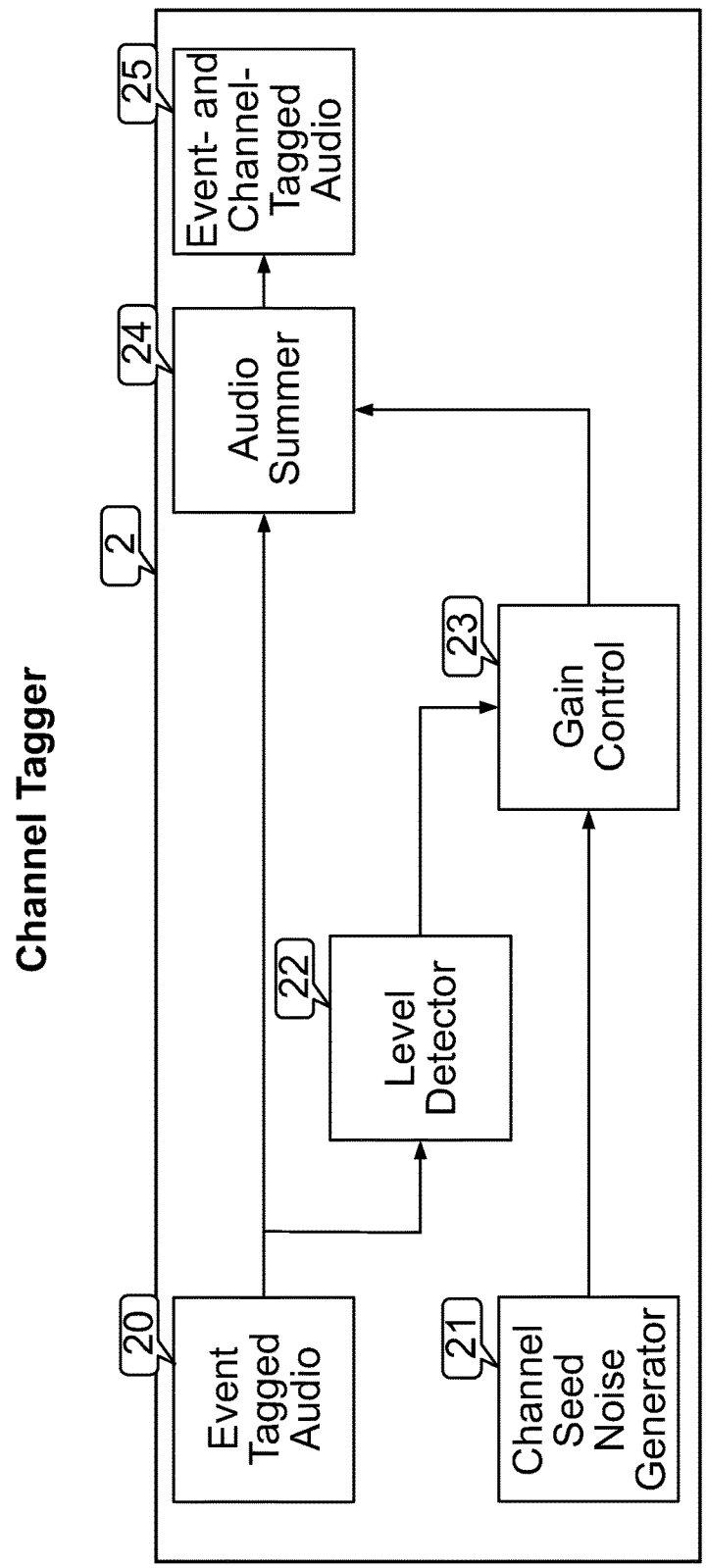
FIG. 2B is a diagram of a channel tagger according to certain example embodiments.

Referring to FIG. 2B, a channel tagger adds the channel tag to event tagged audio (20). Such operation may occur before, after, or in parallel with the generation of event tags. The channel tagger adds a channel seed noise (21) to the audio source (20 (also box 11 of FIG. 1)). The channel seed noise (21) is decorrelated from the event tag seed noise (it is not the same signal at the same point in time—i.e., it is a different and independent signal or is the same signal but offset sufficiently in time, such as by using one white noise loop that is offset several seconds), and typically carries a different spectrum. The channel tag applies the noise at generally a steady amplitude, except when the source audio drops to a level where the channel tag might become audible. Then the level detector (22) instructs the gain control (23) to reduce the level of the channel noise before going to the audio summer (24) to be added to the event tagged audio to create the event- and channel-tagged audio (25).

Figure 2C:
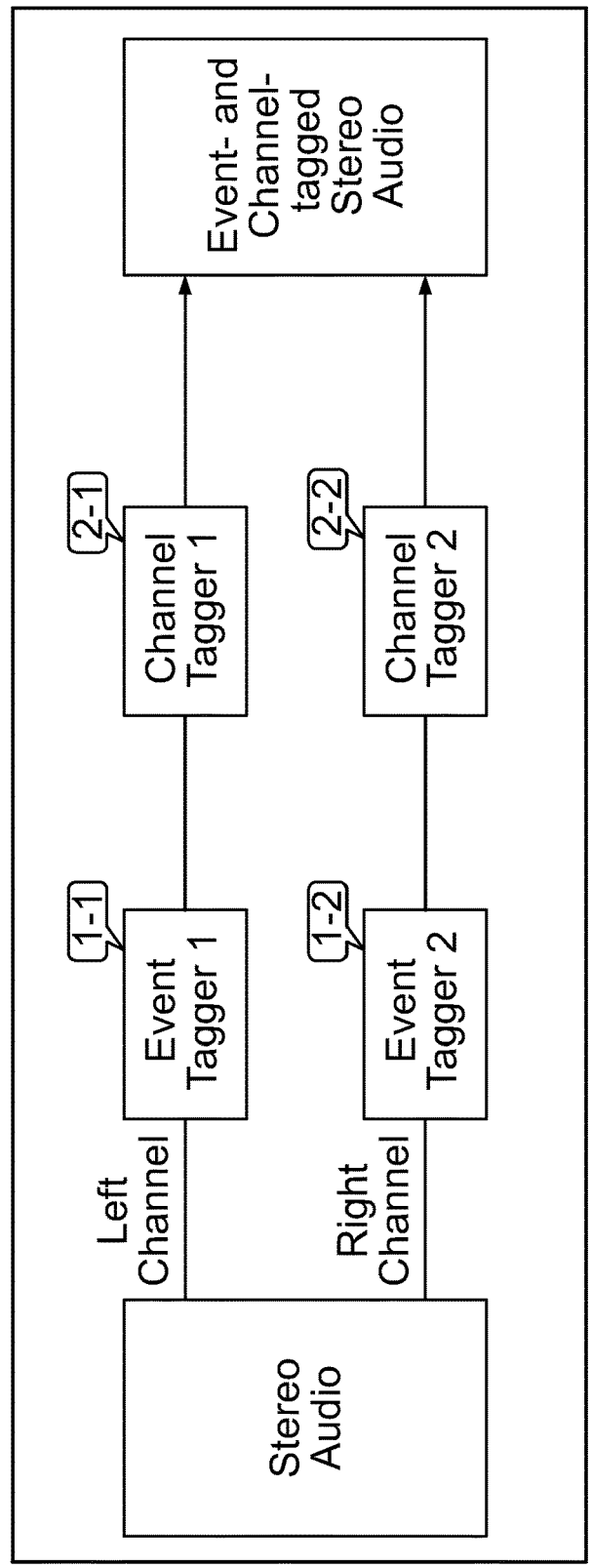
FIG. 2C is a diagram showing the tagging of a stereo audio source according to certain example embodiments.

Referring to FIG. 2C, steps of tagging a stereo audio source (e.g., by supplementing with sub-audible content that is tailored to the signal in a recording) are shown. To tag stereo audio, each channel passes thru a respective event tagger (1-1 and 1-2) and a respective channel tagger (2-1 and 2-2). All Noise generators are decorrelated from each other, for best effect, in this example.

Figure 2D:
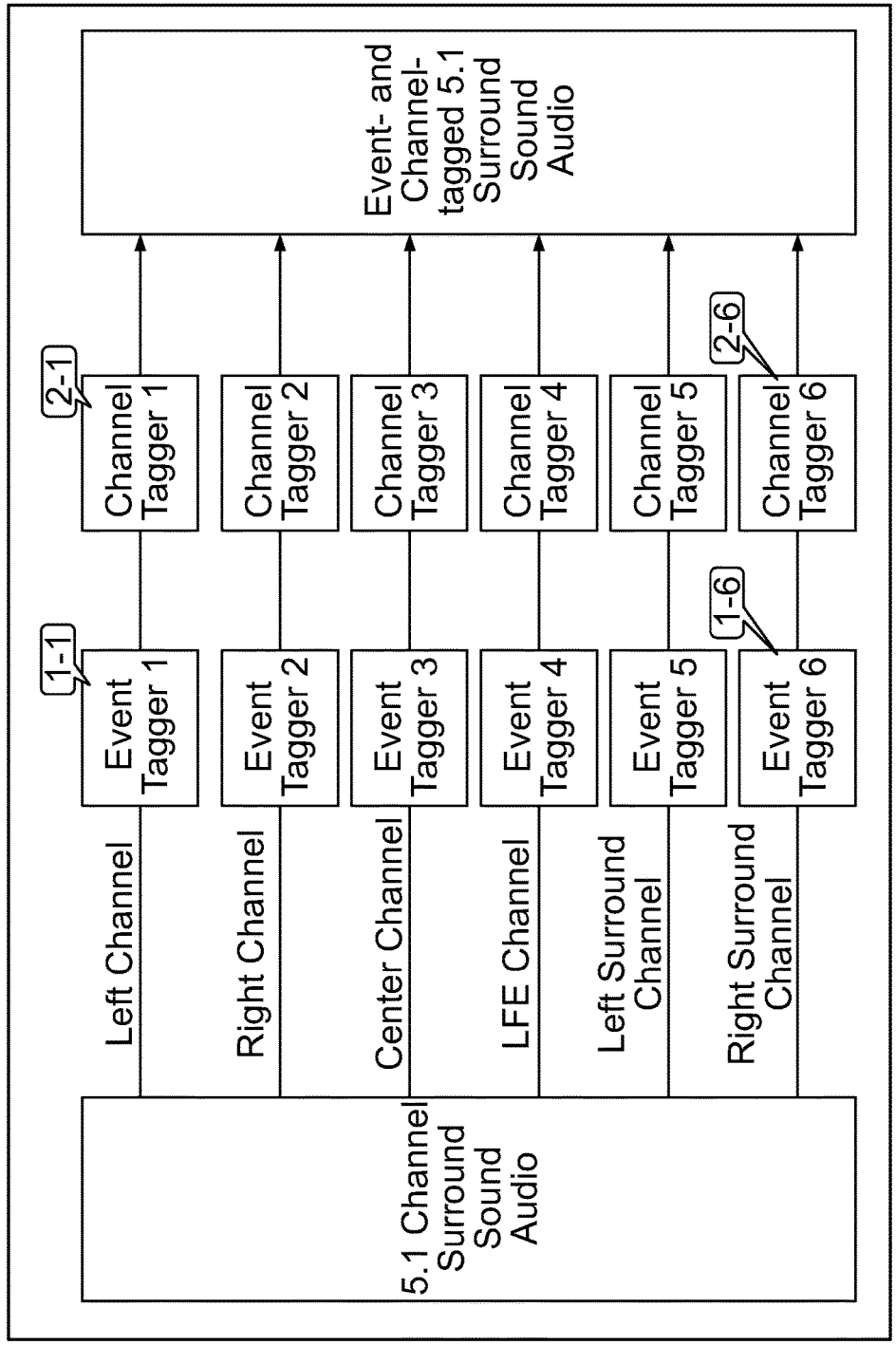
FIG. 2D is a diagram showing the tagging of a 5.1 Channel surround sound audio source according to certain example embodiments.

Referring to FIG. 2D, steps of tagging a 5.1 channel surround sound audio source are shown. To tag 5.1 surround sound audio, each channel passes thru a respective event tagger (1-1 to 1-6) and a respective channel tagger (2-1 to 2-6). All noise generators are decorrelated from each other, for best effect.

Recordings for more channels or fewer channels can follow the same tagging scheme as described above. In particular, each channel can be processed in the manners just discussed, typically in parallel with each other where processing bandwidth permits.

Figure 2E:
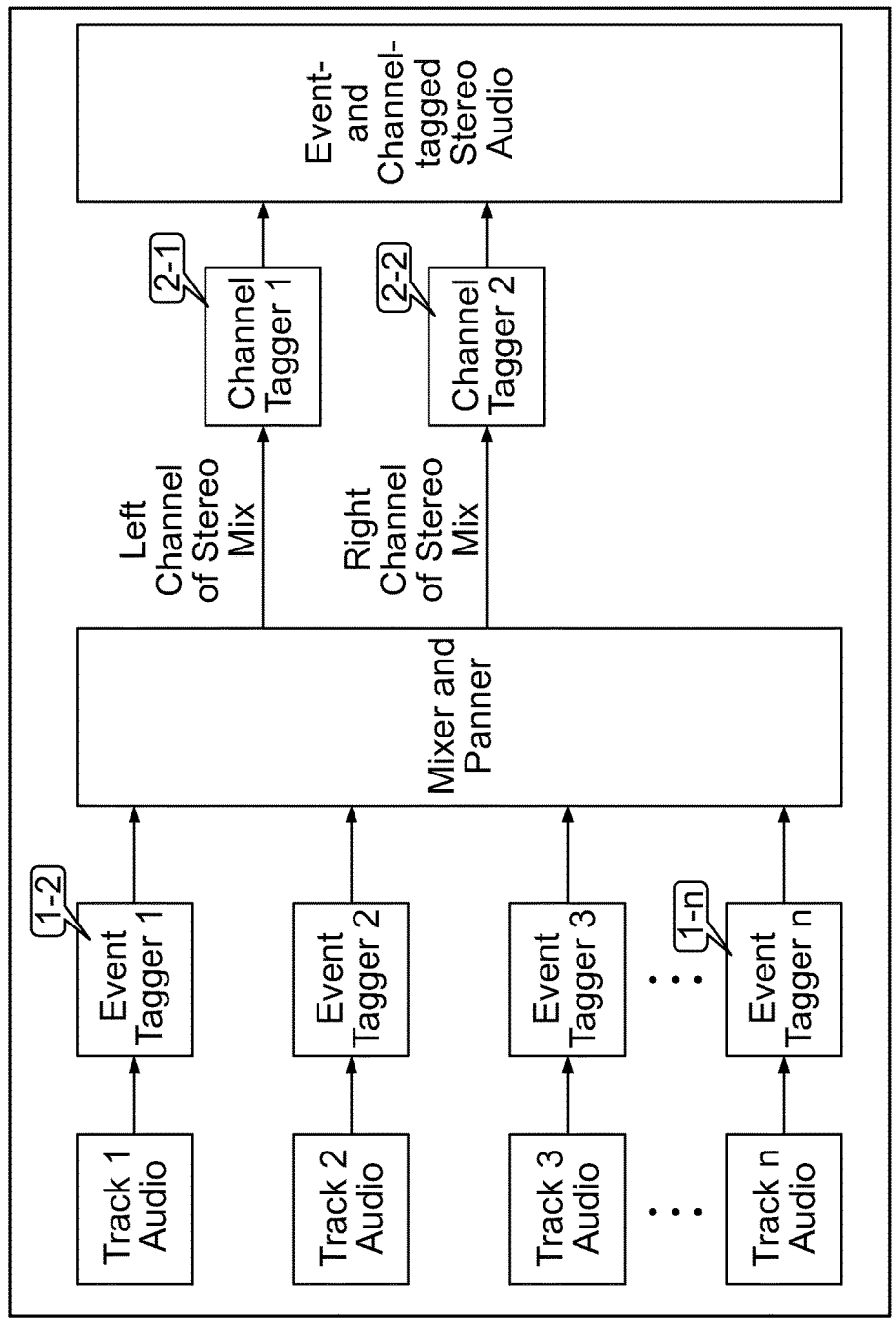
FIG. 2E is a diagram showing event tagging of individual tracks of a multitrack mix prior to mixing and panning to stereo according to certain example embodiments.

Referring to FIG. 2E, steps of event tagging of individual tracks of a multitrack mix prior to mixing and panning to stereo are shown. Such actions may be performed by a recording engineer, typically at a recording studio, and close in time to the tracks being laid down by various musicians. In a similar manner, a soundtrack to a movie may have multiple tracks, such as dialogue, background noise, sound effects, and background music—and those tracks may be mixed with adjustments to their volume and their location in a surround sound space. In other examples (e.g., Dolby Atmos), objects in a soundtrack may be kept separate from each other, and their locations may be resolved when the movie is played. In such situations, the individual processing discussed here may be applied to sound objects rather than to particular channels.

Most modern recordings are done as "multitrack" recordings. A multitrack recording starts as multiple separate synchronized recordings of the different sound components of the recording. For example, in a music recording, each instrument and/or each voice has their own respective recording track. The "mixing" process mixes the different sounds or tracks into the final recording. The advantage of the multitrack recording technique is that, at any later time, the level of each sound in final mix can be adjusted, as well as the placement in the stereo image altered.

Multitrack recordings provide a unique opportunity for tagging in that, when individual instruments or voices can be tagged, the tagging process is even more effective in triggering responses in the human brain. In the case of multitrack recordings, the event tagger is applied to each separate track (1-1 thru 1-N) (that is to say, to each instrument or voice) before the mixer is applied, and the channel tagger (2-1 and 2-2) is applied after the mixer is applied, to each channel that is created by the mixer. All noise generators can be de-correlated from each other for best effect.

Figure 2F:
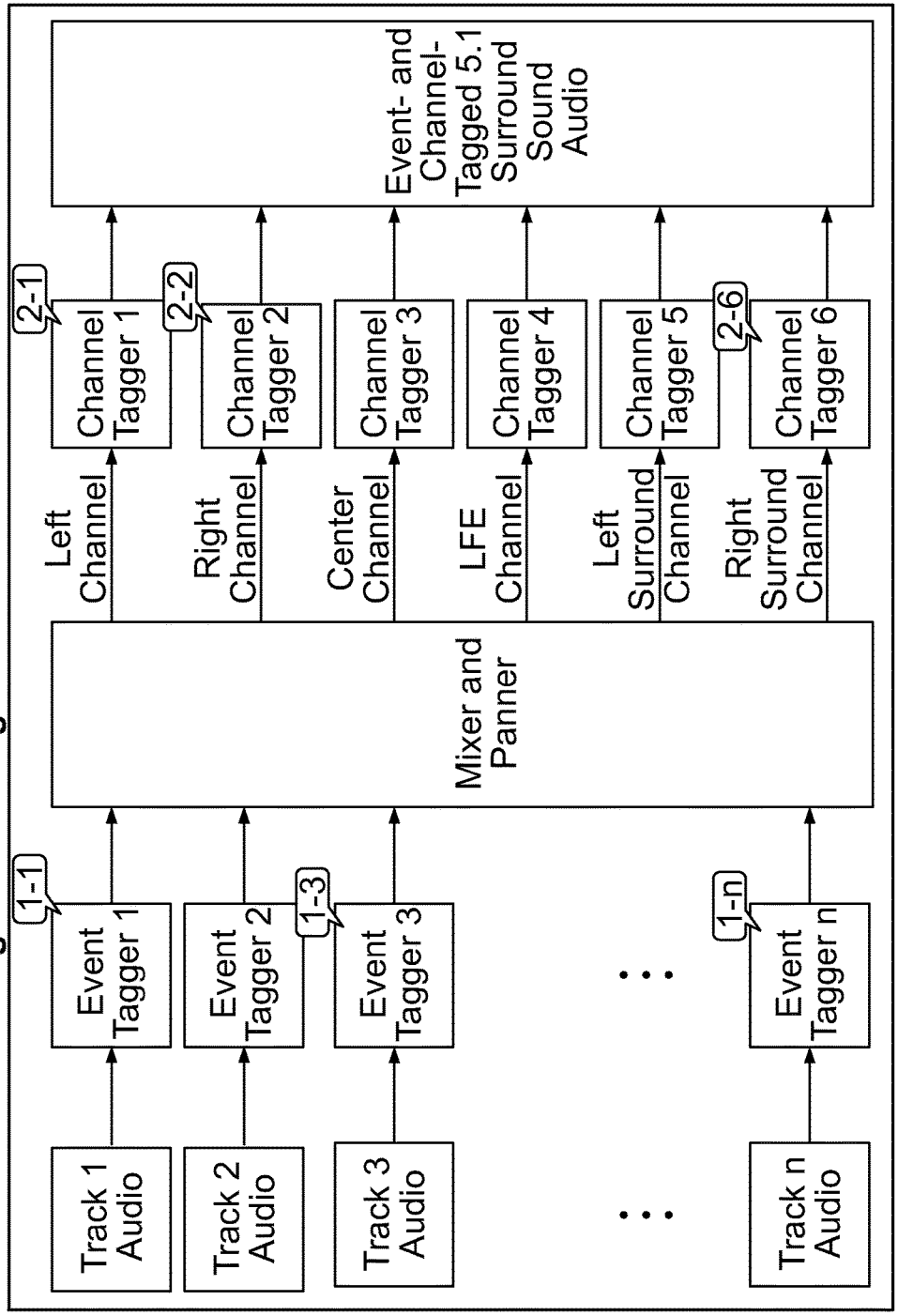
FIG. 2F is a diagram showing event tagging of individual tracks of a multitrack mix prior to mixing and panning to 5.1 surround sound audio according to certain example embodiments.

Referring to FIG. 2F, steps of event tagging of individual separate tracks of a multitrack mix prior to mixing and panning to 5.1 surround sound audio are shown. Surround Sound multitrack recordings are handled in the same way as Stereo multitrack recordings. Each track gets an Event Tagger (1-1 thru 1-N) before the mixer, and then each channel gets a Channel Tagger (2-1 thru 2-6) after the mixer.

The number of channel taggers can be increased or decreased corresponding to an increase or decrease in the number of channels created by the mixer and panner. For example, 7.1 surround sound would include 8 channels, so eight respective channel taggers would be employed. Not all of the channels need to be tagged in this manner, however, such as by tagging seven of the channels but not tagging the sub-woofer channel if such tagging is determined to have less effect on a listener. Thus, a process can tag all or less than all of the channels in a source recording.

Figure 3:
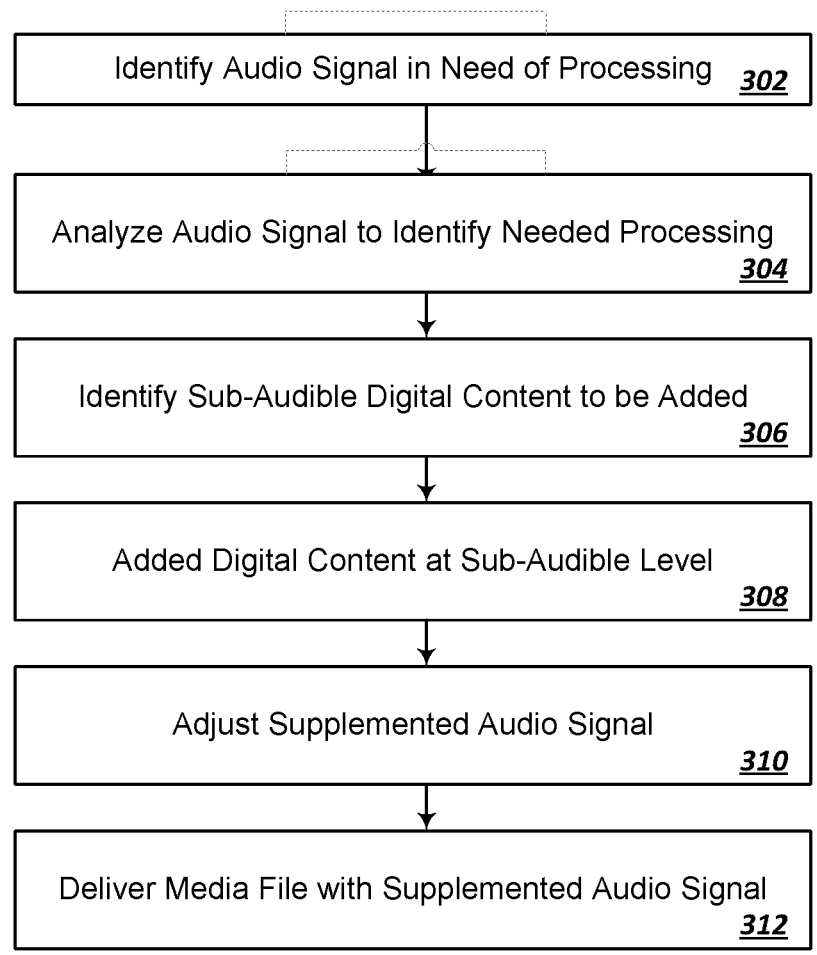
FIG. 3 is a flow diagram showing an example process for supplementing an audio file with sub-audible noise.

FIG. 3 is a flow diagram showing an example process for supplementing an audio file with sub-audible noise. In general, the process involves adding to an audio signal an additional amount of content that is provided at a sub-audible level, so that an ultimate listener cannot consciously hear it, but it causes the listener's brain to change the way the main content of the audio signal is perceived.

The process begins at step 302, where an audio signal is identified as needing processing. As described above, the signal may be in the form of a stored file, and the processing may be en bulk, in that a library of songs, movies, or other types of content is being processed and then saved into a new form for later access by viewers and listeners. The signal may also be in the form of a real-time stream that is playing, such as on a listener's personal music device or as part of a streaming service, such as a streaming movie or music service.

The audio signal is optionally analyzed at box 304 to determine the sort of enhancement that is best deployed to improve the perceived sound of the audio signal when it is played. For example, the file type may be initially analyzed to determine the sort of audio file that is involved, such as a basic MP3 file, a video file with associated 5.1 audio, and other such "type" information for the file. Meta data inside the file may also be read and analyzed to determine the character of the audio signal (e.g., whether it is stereo, 2.1, 5.1, or 7.1 sound, for example). Such analysis can cause the process to select which channels of a multi-channel signal to apply processing to, and to select a particular type of processing—e.g., addition of a particular type of sub-audible noise may work best for a movie, and another type for music. Also, the meta data may be used to access other data about the signal, such as by using meta data to identify the title of a song or album that a file represents (e.g., accessing an internet-accessible database), and then accessing data through the internet to determine an aural fingerprint for the song, such as whether the song is heavy in vocals or instrumentals, and other such information. Such understanding of the type of sound to be encountered may also be used to identify a particular strategy for supplementing the signal with sub-audible content—e.g., for selecting a particular type of content for the sub-audible addition.

Sub-Audible content that was previously in the signal may be maintained or may be removed before supplemental sub-audible content is added. For example, a recording may have sub-audible content that was added by analog or other processes (e.g., inserted by recording on tape) that are part of a recording process. In some situations, such original sub-audible content may be beneficial to improved sound, and in other cases, it may be detrimental and may thus be removed as part of the audio processing that the described process performs on the signal.

In certain instances, the process may recognize that the sub-audible content in a signal was previously added by the process described here, as supplemental content design to improve the sound from the signal. For example, header information in a file may have been modified in a known manner by a prior instantiation of the process, and may initially be identified by a later instantiation of the process. Or the process may recognize the fingerprint t of the sub-audible content in a signal. In such situations, the process may end, and may generate an indication for a user that the signal has already been enhanced. Alternatively, the sub-audible content may be removed, and new sub-audible content may be added to the signal. Or new sub-audible content may be added to the already-processed signal. Such addition will generally have a relatively minor effect on a signal that has already had the same form of sub-audible content added to it, and each subsequent pass of the signal through such a process may have progressively less of an effect on the signal.

At box 306, digital content to be added to the signal is identified. The digital content may be the same for any processing of signals, or can differ for different situations. For example, one type of random noise may be determine to have a better effect on dialogue, while another may have a more positive effect on music—or "soft" music versus "hard" and loud music.

At box 308, the digital content is added at a sub-audible level to the signal. In a simple scenario, for example, tailored white noise may be merged into a signal taken from an MP3 of a song, and the result may be recorded as a new version of the MP3 file. In other situations, the sub-audible content may be added to a file as a separate component from the musical content—e.g., as its own digital "track" in a multi-track recording (though such an approach may require a modification in the output form of the sound file relative to the input, and may also require modifications in playback software that will allow the sub-audible track to be merged with the main tracks at playback-time). In yet other situations, the sub-audible content may be added by decoding circuitry at the time of playback, and thus need not be made an actual part of the stored or streaming sound file.

The actual addition of the sub-audible content may occur in a variety of manners that are appropriate to the particular file format. For example, the audio file (e.g., for a WAV file) may be unpacked and the data in it that represents the main content may be passed through (for each track) one or more filters or amplitude detectors, among other examples. The output of the amplitude detectors, for example, may be used to determine the amplitude at which the sub-audible content is added—where the amplitude of the added sub-audible content varies directly with, and in some cases in linear proportion to, the amplitude of the main content. In addition, such filters may be used to identify the frequency ranges of the dominant part of the sound at any given point in time, and the supplemental sub-audible content may be selected based on such identified frequency ranges, or the actual characteristics of the sound may be shaped based on such identified frequency ranges (e.g. a process may begin with full-spectrum white noise, and may filter it down to a particular frequency range).

In certain circumstances, the file format may be changed before such analysis and supplementation occur. For example, an MP3 file may be converted to a WAV file, the analysis and supplementation may be performed on the WAV file, and the supplemented file may be converted to an MP3 file before being output by the process. In certain circumstances, it may be possible that such translation may affect the audible portion of the content, so that the process may perform corrective operations on the audible content before or after the conversion back to the first file format in order to counteract and erase those changes.

The particular sub-audible content that is added and the way it is added may vary over time across a sound file—dynamic "tag" selection. For example, the sub-audible content may be added only to a channel, of a multi-channel signal, that is currently the dominant channel. Or the sub-audible content may be added only when the signal (or a particular channel of the signal) is operating within a particular frequency range (e.g., enhancement for "treble" but not for "bass," or vice-versa). As another example, the use of enhancement or the selection of the supplemental content to draw from for the sub-audible content may depend on a deeper analysis of the main content of the signal, such as by performing analysis to determine the type of the content (e.g., music, dialogue, explosion noise, background noise, etc.), and selecting content for supplementation that is a type of content known to interact particularly well with the identified type of main content.

Such dynamic adjustment may be performed in real-time as the sound file is processed. Alternatively, the sound file may be processed in two passes. First, an analyzer tool may step through the file to identify signatures that represent particular types of sound, and may associate those signatures with particular times in the laying of the file. The process may then select the sounds to serve as sub-audible supplementations, and may insert them at the particular times into the sound signal, as a second pass. In other situations, the analysis of the basic content of a sound file, the selection of supplemental content, and the addition of that supplemental content to the main content from the sound file may happen all at once, and may happen continuously throughout the file—whether that occurs before the file is played to a listener or at the same time the file is played to a listener.

At box 310, the supplemented audio signal may optionally be adjusted in various manners. For example, filtering may be performed to remove high or low or other frequencies of content so as to reduce inaudible sounds that may be of adequate volume but outside the frequency range of human hearing, if a determination has been made that such removal will not harm or may even help the sounds of the supplemented content. Also, adjustments may be made to the overall gain in a signal so as to ensure that it will play at a proper volume when the file is played by a user (i.e., a volume consistent with the volume of other recordings of a same style). Moreover, where the particular supplementation is known to change defined parts of the origin al audible content, those changes may be reversed in post-processing (e.g., by adding back transients that may be loss by the process or steps related to the processing such as converting an audio file from one format to another).

Non-content-based adjustments may also be made, such as by updating meta data for a file that holds content that has been supplemented in the manners discussed here. For example, the header information in a sound file may be edited to indicate to a subsequent reader/player that the supplementation of this particular type has occurred (e.g., so that such a player may adjust its settings to maximize the effect of the supplemented signal, or can provide a visual or audible indication to a user of a player that supplemented content is being played, so that perhaps a user can choose to access a non-supplemented file instead).

At box 312, the supplemented sound file is played or stored or both. Where the sound file is simply being processed to improve its sound, but there is no current listener for the file, the file can be saved for future accessing. The saved supplemented file may be of the same type (MP3, WAV, etc.) as the file for the original sound so that it can beneficially be played on any device that could play the original file. Where a user is experiencing the file by streaming, it may be processed in advance, saved, and then streamed simply by playing it, or it may be supplemented as it is played, where the supplementing and other processing may occur at the server that provides the stream or the client device that plays the stream to the user. Such various processing/supplementing and playing scenarios are shown as examples, in FIG. 1B above.

In certain implementations, the sound file may be played in the same manner as an unsupplemented file of the same format would be played (e.g., a personal music device may play an MP3 file in a conventional manner, though the file is unconventional because it has been supplemented). In other implementations, additional meta data may be provided (e.g., in the file itself, such as in its header information) so as to affect the manner in which supported decoders/players play the sound file. For example, certain parameters about the processing applied to the file may be provided in meta data, and a player/decoder may use such parameter information to change its playback settings in a manner that maximizes the quality of the sound that is played and the effect on the listener.

EXAMPLE

In a limited experiment, brain activity of a healthy male subject was identified as a function of different audible inputs played through headphones. The subject was provided with a worn head harness having 248 SQUIDs and attached to a dewar machine to measure electro-magnetic fluctuations of the subject's brain. While being monitored in this manner, the subject was played clips of different various musical selections of ten seconds each in length. Each clip was played once in its original, unprocessed form, and once in a form processed using the techniques discussed herein. The subject was also played a clip of white noise ten seconds long between each of the music clips. Magnetoencephalography (MEG) readings were taken of the subject while the clips were played. The order of play was quasi-random—generally random except that processed and unprocessed copies of the same clip were never played in succession with each other.

The music was generated by an amplifier and transducers located outside the testing room, and was delivered to the subject through long pneumatic tubes so as to positionally locate magnetic activity away from the SQUIDs. The subject was generally in a lying position while listening and generally with his eyes closed. Each music clip was ten seconds long, as was the white noise clip. There were 40 total clips played—20 white noise and 20 music (with 10 treated and 10 not treated). The music was instrumental (no human voice).

The brain activity of the subject, measured in the dewar machine in femto-Tesla was averaged across each clip, and the averages for each unprocessed clip were then average to form an estimated mean of means. Similarly, the average MEG readings for each processed clip were averaged.

The results indicate noticeably higher brain average activity when the processed clips were played than when the unprocessed clips were played. The results also indicate noticeably higher average brain activity when either processed or unprocessed music clips were played than when white noise was played.

The results indicate significantly bigger overall MEG brain activation to recordings processed by the techniques described herein. The conclusion is then that the human brain responds differentially to digitized music recordings supplemented with tailored, sub-audible content. Further studies are needed to determine the behavioral and other physiological effects of such processing.

Figure 4:
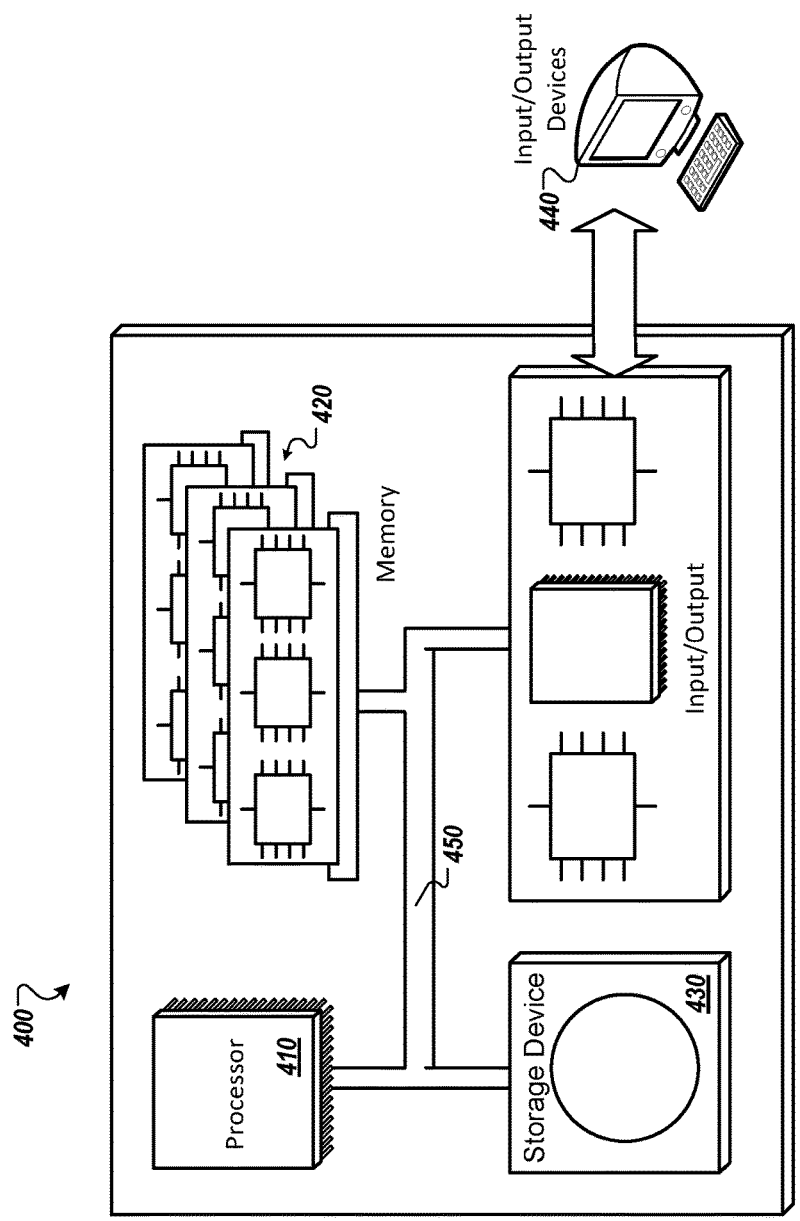
FIG. 4 shows an example computer system that can be used singularly or in multiples to carry out the techniques described herein.

FIG. 4 is a schematic diagram of a computer system 400, which may be used to provide recording supplementation of the kind discussed herein. The system 400 can be used to carry out the operations described in association with any of the computer-implemented methods described previously, according to one implementation. The system 400 is intended to include various forms of digital computers, such as laptops, desktops, workstations, personal digital assistants, servers, blade servers, mainframes, and other appropriate computers. The system 400 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 400 includes a processor 410, a memory 420, a storage device 430, and an input/output device 440. Each of the components 410, 420, 430, and 440 are interconnected using a system bus 450. The processor 410 is capable of processing instructions for execution within the system 400. The processor may be designed using any of a number of architectures. For example, the processor 410 may be a CISC (Complex Instruction Set Computers) processor, a RISC (Reduced Instruction Set Computer) processor, or a MISC (Minimal Instruction Set Computer) processor.

In one implementation, the processor 410 is a single-threaded processor. In another implementation, the processor 410 is a multi-threaded processor. The processor 410 is capable of processing instructions stored in the memory 420 or on the storage device 430 to display graphical information for a user interface on the input/output device 440.

The memory 420 stores information within the system 400. In one implementation, the memory 420 is a computer-readable medium. In one implementation, the memory 420 is a volatile memory unit. In another implementation, the memory 420 is a non-volatile memory unit.

The storage device 430 is capable of providing mass storage for the system 400. In one implementation, the storage device 430 is a computer-readable medium. In various different implementations, the storage device 430 may be a floppy disk device, a hard disk device, an optical disk device, or a tape device.

The input/output device 440 provides input/output operations for the system 400. In one implementation, the input/output device 440 includes a keyboard and/or pointing device. In another implementation, the input/output device 440 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touch-screen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer-implemented signal processing method for enhancing digital audio, the method comprising:
    identifying a digital sound file stored on tangible storage that contains data for producing audible sound content in the form of speaking, music, or both;
    identifying and selecting, with a digital sound processing system that modifies audio files, a digital source of supplemental non-harmonic sound content to be added to the audible sound content of the digital sound file;
    accessing a copy of the digital sound file, with the digital sound processing system, to edit data in the digital sound file that contains the data for producing the audible sound content;
    electronically adding the supplemental non-harmonic sound content to the audible sound content across a substantial length of the audible sound content, with the digital processing system, to produce supplemented sound content, wherein the supplemental non-harmonic sound content has a sub-audible volume in the supplemented sound content with a frequency range that would be audible if it was provided at an audible volume; and
    digitally storing the supplemented sound content as a digital combination of the audible sound content and the supplemental sub-audible non-harmonic sound content in a format that the digital combination can subsequently be played together as one presentation to one or more users as concurrent audible and sub-audible sound.

2. The computer-implemented method of claim 1, wherein the digital sound file includes both visual and audible components.

3. The computer-implemented method of claim 1, wherein the supplemental sound content comprises random noise.

4. The computer-implemented method of claim 3, wherein the random noise comprises white noise or pink noise.

5. The computer-implemented method of claim 1, further comprising:
    identifying one or more channels of a multi-channel sound signal to which supplementation is to be applied; and
    adding the supplemental sound content to only the identified one or more channels which are a sub-set of all the channels in the multi-channel sound signal.

6. The computer-implemented method of claim 1, further comprising:
    identifying a particular sound item in the audible sound content;
    selecting the supplemental non-harmonic sound content so that it has a frequency range that overlaps with a frequency range of the identified particular sound item; and
    adding the supplemental non-harmonic sound content to the audible sound content in the selected frequency range.

7. The computer-implemented method of claim 1, further comprising transmitting the supplemented sound content to a plurality of different client audio players for playing of the audio to users so that the users consciously hear the audible sound content, but do not consciously hear the supplemental non-harmonic audio content.

8. The computer-implemented method of claim 1, wherein the supplemented non-harmonic sound content is arranged to produce cognitive effects in a listener that are not achieved when the listener is presented with the audible sound content only.

9. The computer-implemented method of claim 1, wherein the supplemental non-harmonic sound content comprises:
    a first source of sound content whose volume in the supplemented sound content is made to vary over time in correlation with changes in volume of the audible content; and
    a second source of sound content that is selected and added to the original content that is separate from the first source of sound content and does not vary in volume with changes in volume of the audible content.

10. The signal processing method of claim 1, wherein electronically adding the supplemental non-harmonic sound content to the audible sound content comprises:
    identifying a particular sound item that lasts a short time period as a sub-part of the digital sound file;
    selecting an audio event tag that corresponds to the short time period; and
    adding the audio event tag as non-harmonic sound content that is sub-audible in volume for a location in the sound file that corresponds to the particular identified sound item.

11. The signal processing method of claim 10, wherein electronically adding the supplemental non-harmonic sound content to the audible sound content further comprises adding an audio channel tag at a sub-audible volume to at least one channel of the audible sound content for a period that is most of a duration of the audible sound content, so that the digitally stored supplemented sound content includes one or more audio event tags and the audio channel tag.

12. The signal processing method of claim 1, further comprising switching from a first format to a second format of supplemental non-harmonic sound content within the content of the digital sound file.

13. The computer-implemented method of claim 1, further comprising:
- adding supplemental non-harmonic sound content to the audible sound content at a first sub-audible volume;
- determining that an volume of the audible sound content has increased; and
- in response to the determining, adding supplemental non-harmonic sound content to the audible sound content at a second sub-audible volume that is greater than the first sub-audible volume.

14. A digital sound file stored on a tangible, non-transitory medium and made by a process of steps that comprise:
- identifying a tangibly-stored digital sound file that contains data for producing audible sound content in the form of speaking, music, or both;
- identifying and selecting, with a digital sound processing system that modifies audio files, a digital source of supplemental non-harmonic sound content to be added to the audible sound content of the digital sound file;
- accessing a copy of the digital sound file, with the digital sound processing system, to edit data in the digital sound file that contains the data for producing the audible sound content;
- electronically adding the supplemental non-harmonic sound content to the audible sound content across a substantial length of the audible sound content, with the digital processing system, to produce supplemented sound content, wherein the supplemental non-harmonic sound content has a sub-audible volume with a frequency range that would be audible if it was provided at an audible volume; and
- digitally storing the supplemented sound content as a digital combination of the audible sound content and the supplemental sub-audible non-harmonic sound content in a format that the digital combination can subsequently be played together as one presentation to one or more users as concurrent audible and sub-audible sound.

15. The digital sound file of claim 14, wherein the steps further comprise:
- identifying one or more channels of a multi-channel sound signal to which supplementation is to be applied; and
- adding the supplemental sound content to only the identified one or more channels that are a sub-set of all of the multi-channel sound signal.

16. The digital sound file of claim 14, wherein the steps further comprise:
- identifying a particular sound item in the audible sound content, that is distinct from other different sound items in the audible sound content
- selecting the supplemental non-harmonic sound content so that it has a frequency range that overlaps with a frequency range of the identified particular sound item; and
- adding supplemental non-harmonic sound content to the audible sound content in the selected frequency range.

17. The digital sound file of claim 14, wherein the steps further comprise transmitting the supplemented sound content to a plurality of different client audio players for playing of the audio to users so that the users consciously hear the audible sound content, but do not consciously hear the supplemental non-harmonic sound content.

18. The digital sound file of claim 14, wherein the supplemented sound content is arranged to produce cognitive effects in a listener that are not achieved when the listener is presented with the audible sound content only.

19. The digital sound file of claim 14, wherein the supplemental non-harmonic sound content comprises:
- a first source of sound content whose volume in the supplemented sound content is made to vary over time in correlation with changes in volume of the audible content; and
- a second source of sound content that is selected and added to the original content that is separate from the first source of sound content and does not vary in volume with changes in volume of the audible content.

20. A device containing one or more tangible, non-transitory machine-readable storage media that store instructions that, when executed by one or more computer processors, perform operations comprising:
- identifying a tangibly-stored digital sound file that contains data for producing audible sound content in the form of speaking, music, or both;
- identifying and selecting, with a digital sound processing system that modifies audio files, a digital source of supplemental non-harmonic sound content content to be added to the audible sound content of the digital sound file;
- accessing a copy of the digital sound file, with the digital sound processing system, to edit data in the digital sound file that contains the data for producing the audible sound content;
- electronically adding the supplemental non-harmonic sound content to the audible sound content across a substantial length of the audible sound content, with the digital processing system, to produce supplemented sound content, wherein the supplemental non-harmonic sound content has a sub-audible volume in the supplemented sound content with a frequency range that would be audible if it was provided at an audible volume; and
- digitally storing the supplemented sound content as a digital combination of the audible sound content and the supplemental sub-audible non-harmonic sound content in a format that the digital combination can subsequently be played together as one presentation to one or more users as concurrent audible and sub-audible sound.

21. The device of claim 20, wherein the operations further comprise:
- identifying one or more channels of a multi-channel sound signal in the digital sound file to which supplementation is to be applied; and
- adding the supplemental sound content to only the identified one or more channels which are a sub-set of all the channels in the multi-channel sound signal.

22. The device of claim 20, wherein the operations further comprise:
- identifying a particular sound item in the audible sound content, that is distinct from other different sound items in the audible sound content
- selecting the supplemental non-harmonic sound content so that it has a frequency range that overlaps with a frequency range of the identified particular sound item; and adding supplemental non-harmonic sound content to the audible sound content in the selected frequency range.

23. The device of claim 20, wherein the operations further comprise transmitting the supplemented sound content to a plurality of different client audio players for playing of the audio to users so that the users consciously hear the audible sound content, but do not consciously hear the non-harmonic supplemental audio content.

24. The device of claim 20, wherein the supplemented sound content is arranged to produce cognitive effects in a listener that are not achieved when the listener is presented with the audible sound content only.

25. The device of claim 20, wherein the supplemental sound content comprises:
   a first source of sound content whose volume in the supplemented sound content is made to vary over time in correlation with changes in volume of the audible content; and
   a second source of sound content that is selected and added to the original content at a sub-audible level, and that is separate from the first source of sound content and does not vary in volume with changes in volume of the audible content.

* * * * *